United States Patent [19]

Ullman et al.

[11] 3,896,533

[45] July 29, 1975

[54] TOOL FOR INSERTING AND REMOVING CIRCUIT COMPONENTS

[75] Inventors: Robert Ullman, Harrisburg; Earl William Wagner, Annville, both of Pa.

[73] Assignee: AMP Incorporated, Harrisburg, Pa.

[22] Filed: July 10, 1974

[21] Appl. No.: 487,340

[52] U.S. Cl. ................ 29/203 B; 29/203 H; 29/427
[51] Int. Cl. ............................................ H05k 3/32
[58] Field of Search ....... 29/203 B, 203 H, 203 HM, 29/203 HC, 203 P, 206, 427

[56] References Cited

UNITED STATES PATENTS 3,535,763 10/1970 Helton ............................. 29/203 H
3,699,629 10/1972 Hood, Jr. et al. ................ 29/203 H

*Primary Examiner*—Carl E. Hall
*Attorney, Agent, or Firm*—Robert W. Pitts; F. W. Raring; Jay L. Seitchik

[57] ABSTRACT

A tool head for a hand tool used to insert and extract dual in-line electronic circuit devices employs mating surfaces on the tool head walls for precise alignment of the electrical leads and is actuated by a plunger moving normal to the circuit device. A gripping spring which is flexed and compressed by the walls of the tool head upon movement of the plunger firmly holds the circuit device in position against a piston mounted on the plunger.

5 Claims, 11 Drawing Figures

TOOL FOR INSERTING AND REMOVING CIRCUIT COMPONENTS

BACKGROUND OF THE INVENTION

This invention provides a tool for inserting and removing dual-in-line integrated circuit devices from multi-contact connectors or printed circuit boards. The circuit devices envisioned have multiple electrical leads mounted on a rigid backing. Among the tools used for handling such circuit devices are those disclosed in U.S. Pat. No. 3,443,297 and U.S. Pat. No. 3,535,763. Another device used for the insertion and removal of a somewhat different electrical component is found in U.S. Pat. No. 3,210,836. The invention presented here enables an operator to precisely position the device in a multi-contact connector mounted on a printed circuit board or insert the device directly into free-standing terminals in the printed circuit board.

Precise location of the device on the connector is necessary to prevent damage to the electrical leads. By employing mating edges on the tool head and the multi-contact connector header, the leads will fit into the receptacles on the connector without damage to the leads. The tool also provides a method for easy removal of the circuit device from the connector again without damage. These and other objects of the invention are achieved in a preferred embodiment thereof which is briefly described in the foregoing abstract, which is described in detail below, and which is shown in the accompanying drawing in which:

FIG. 5 is a sectional view of the tool head as it appears when mounted on a pistol-type hand-held actuator suitable for use with the tool.

Figure 1:
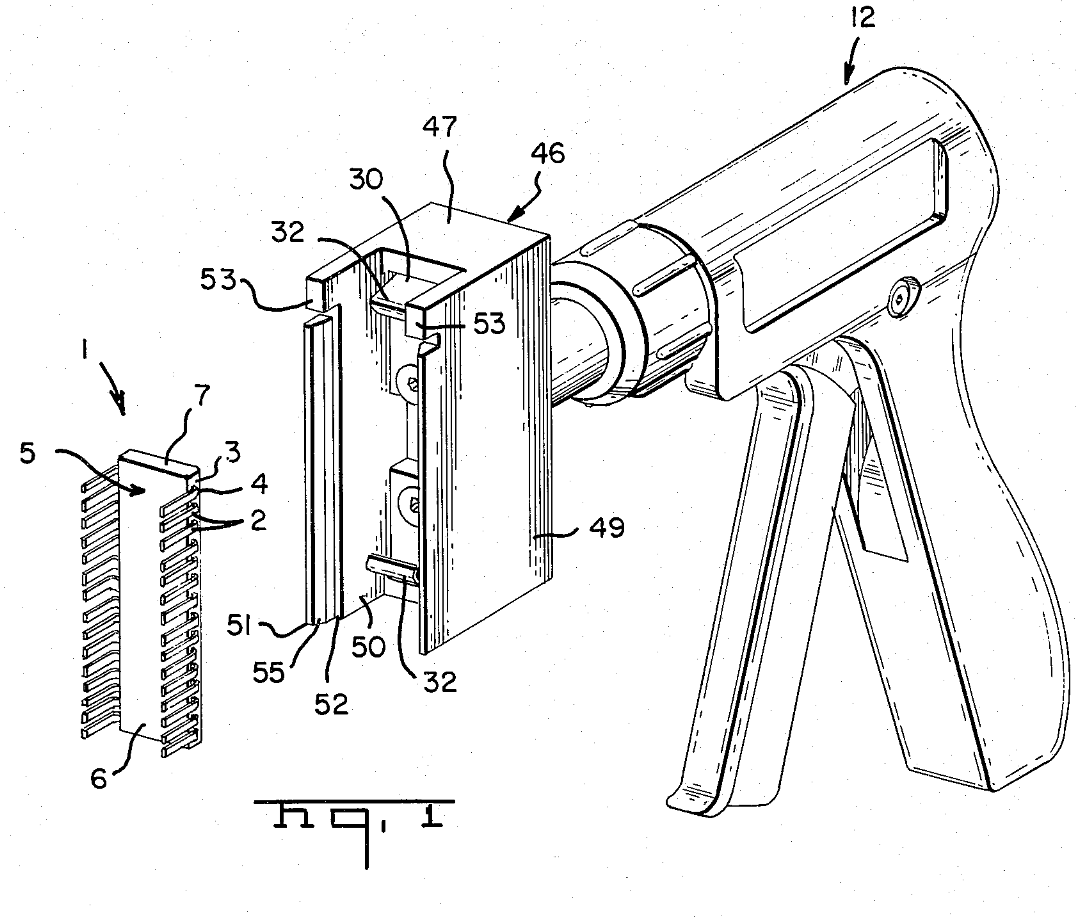
FIG. 1 is a perspective view of the preferred form of the tool mounted on a suitable hand held actuator. A typical circuit device with which the tool would be used is also shown.

Referring to FIG. 1, the disclosed embodiment of this invention is particularly adapted to the handling of integrated circuit devices 1. These circuit devices 1 have a hard backing 5 generally formed from plastic. Multiple electrical leads 2 extend from opposed sides 3 of the device. These leads 2 generally have a right angle bend 4 so that the leads 2 are essentially normal to the principal faces 6 of the rigid backing 5.

The tool head 46 shown in FIG. 1 employs spring arms 32 to grip the circuit device 1 on the sides 7 without leads 2.

Figure 2:
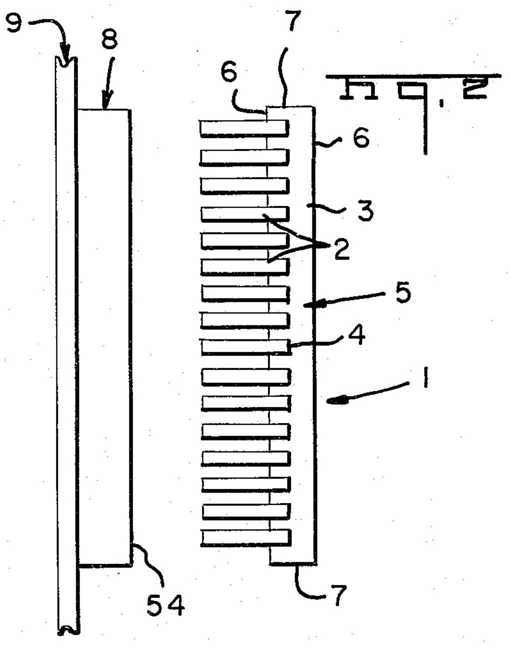
FIG. 2 is a side view of the circuit device and the multi-contact connector into which the device is to be inserted.
Figure 3:
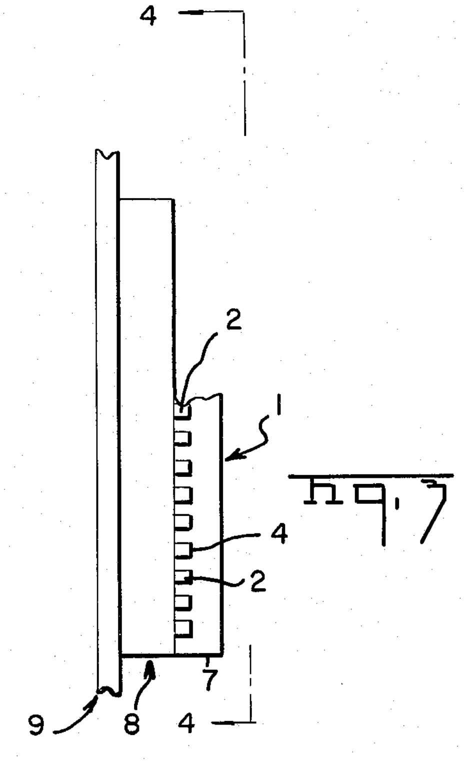
FIG. 3 is a view similar to FIG. 2 showing the device as it appears when inserted into the multi-contact connector.
Figure 4:
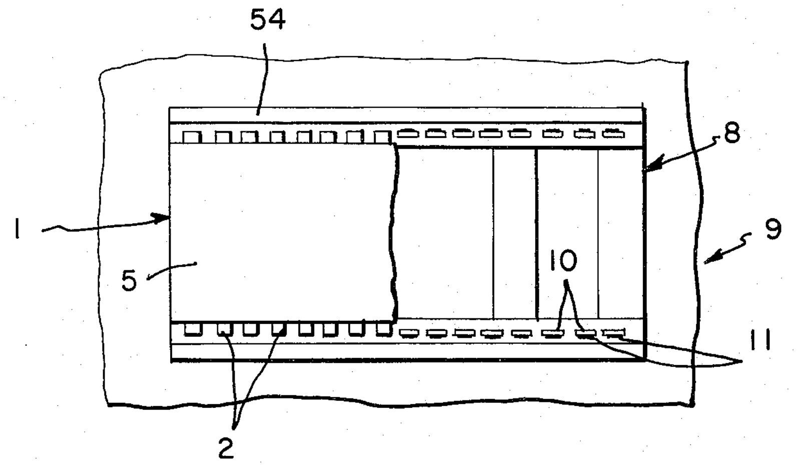
FIG. 4 is a fragmentary view of the circuit device as it appears when inserted into the multi-contact connector.

FIGS. 2, 3, and 4 show the circuit device 1 as it is employed in conjunction with a multi-contact connector header 8 mounted on a printed circuit board 9. Although this embodiment of the tool is particularily adapted for use with this configuration, it could also be used with other arrangements. In the fragmentary view shown in FIG. 4, the receptacles 10 on the multi-contact connector header 8 are clearly shown. The electrical leads 2 are inserted into these receptacles 10 so that electrical contact is made with the receptacle contacts 11.

FIG. 5 is a sectional view depicting the tool head 46 as it appears when mounted on a pistol-type actuator 12 in the preferred embodiment of the invention. The pistol-type actuator 12 is essentially the same as that employed in U.S. Pat. No. 3,742,571. The contoured surface 21 of lever 23 is employed to drive a spring loaded plunger 17. When the lever 23 is rotated in a counter clockwise direction, the plunger 17 is driven to the left in FIG. 5. The plunger 17 is attached to a support piston 28 in the tool 46 by means of a screw 29.

Figure 7:
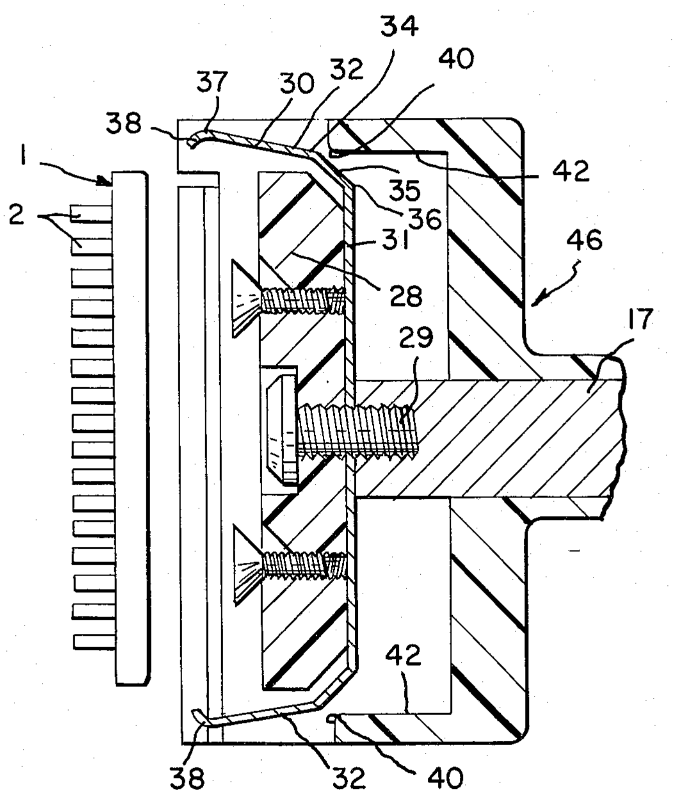
FIG. 7 is a sectional view of the tool head in the extended position just prior to grasping the circuit device.
Figures 6, 7:
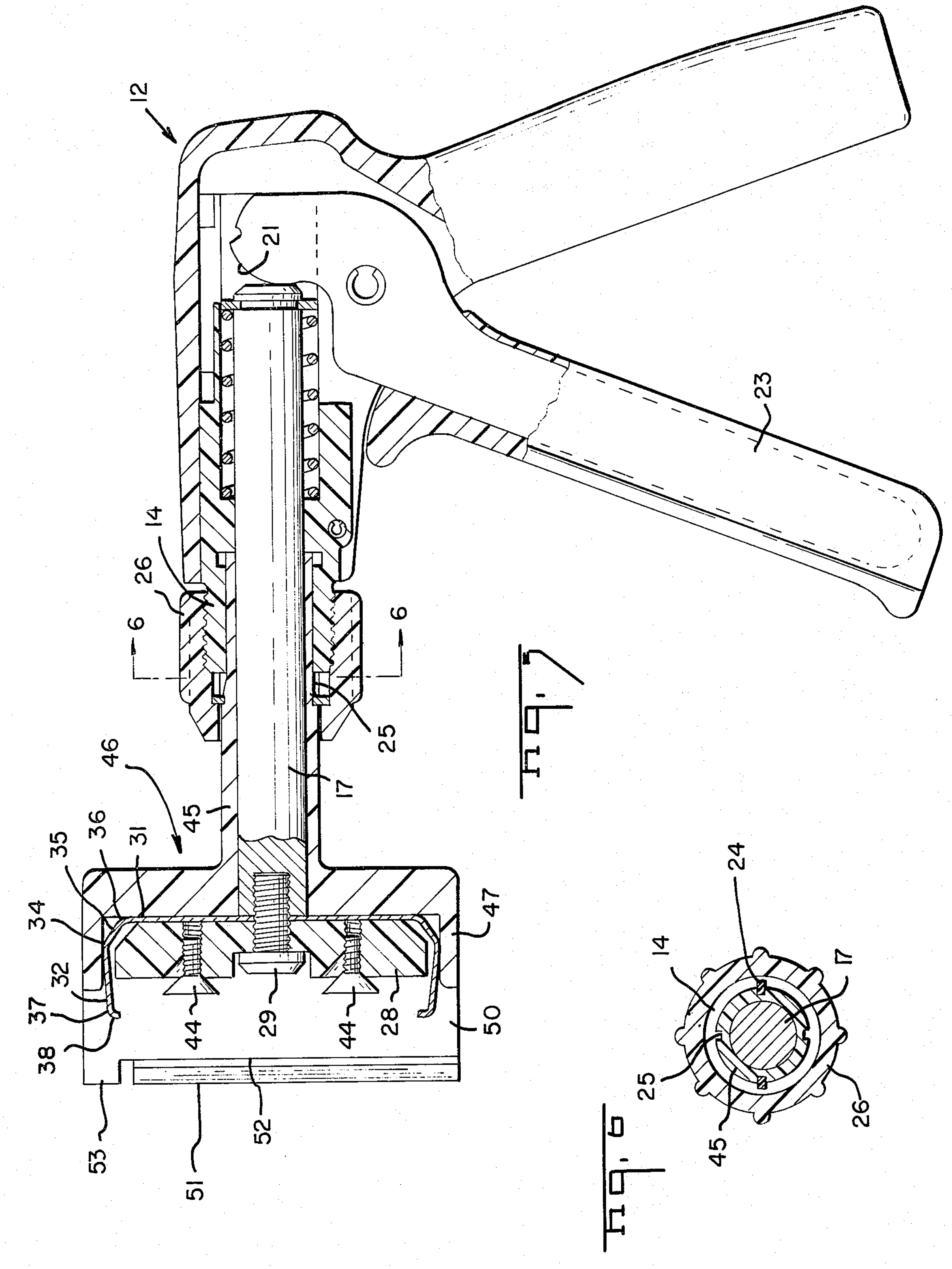
FIG. 6 is a sectional view of the locking collar used to attach the tool head to the actuator.

FIG. 6 is a sectional view of the mechanism used to attach the tool head barrel 45 onto the pistol-type actuator 12. Keys 24 integral with the barrel 14 of the pistol body secure the tool head 46 against rotation when properly inserted in keyways 25 integral with the tool head barrel 45. A locking collar 26 engages a snap locking ring 27, best shown in FIG. 5, to secure the tool head 46 to the pistol-type actuator 12.

A support piston 28 is located in the cavity formed by the opposed sidewalls 49 and opposed end walls 47 of the tool head 46. Extension of the plunger 17 causes the support piston to progressively assume the positions shown in FIGS. 8 thru 10. FIG. 7 depicts the plunger 17 and support piston 28 in the extended position and shows the action of the retaining spring 30. The rear portion 31 of the retaining spring is attached to the rear of the support piston 28. The retaining spring has opposed arms 32 with gripping surfaces or fingers 38 on the ends. These fingers 38 are designed to securely grip the circuit device 1. When the support piston 28 is in the extended position the spring 30 is free to relax to the position shown in FIG. 7. In this relaxed position, the opposed fingers 38 are sufficiently separated to permit them to engulf the circuit device 1.

Figures 8, 9, 10:
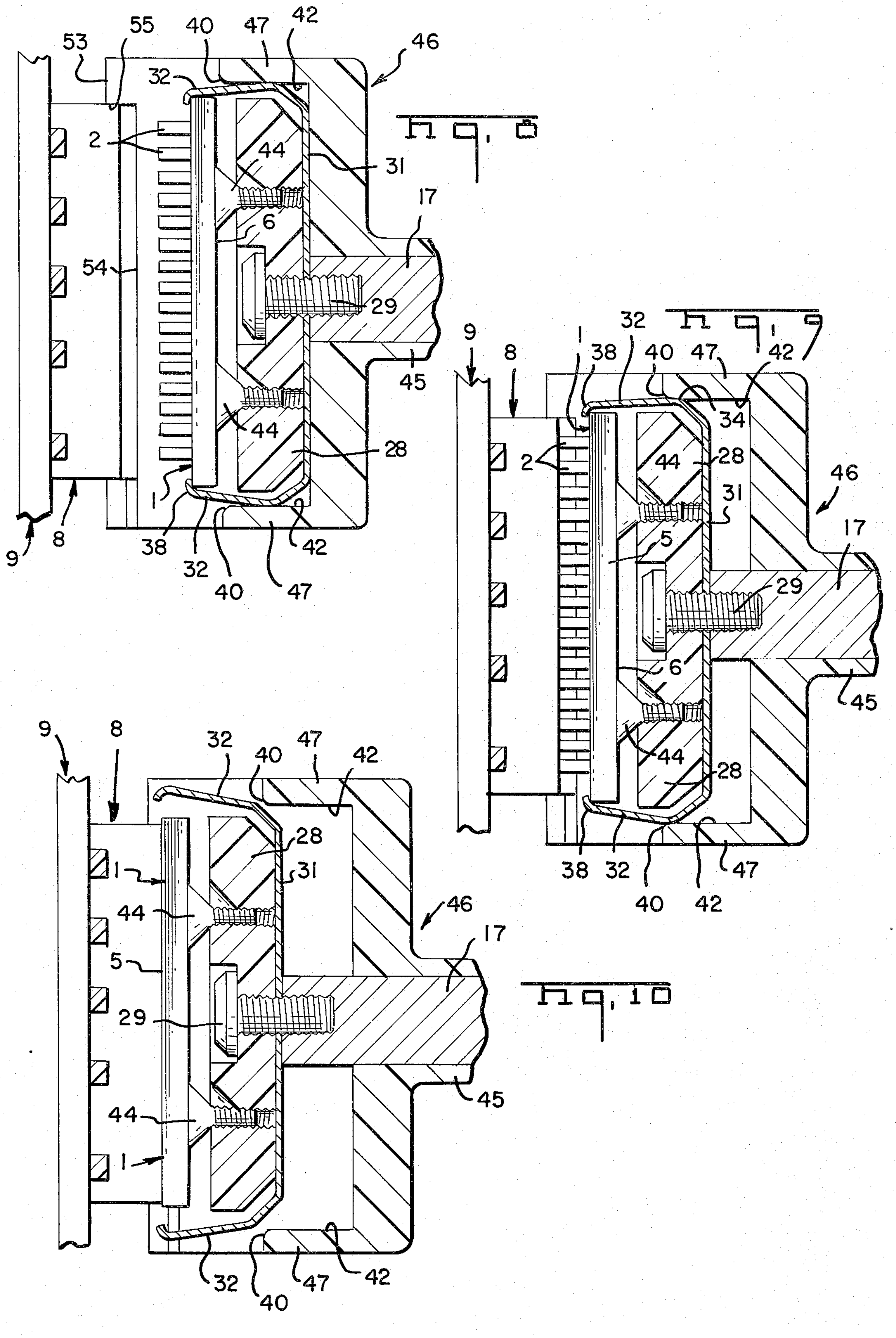
FIG. 8 is a sectional view of the tool head in the retracted position with the circuit device firmly grasped by the tool.
FIG. 9 is a view similar to FIG. 8 showing the tool in an intermediate position.
FIG. 10 is a view similar to FIG. 7 but showing insertion of the circuit device into the multi-contact connector.

FIG. 9 shows the action of the tool which enables the retaining spring 30 to grasp the circuit device 1. As the plunger 17 moves from the extended position of FIG. 7 to the intermediate position of FIG. 9, the spring arms 32 come in contact with the tool head end walls 47. The end wall inner shoulders 40 contact the retaining spring arms 32 in the neighborhood of a bend or knee 34. Upon contact with the inner shoulders 40 and inner surfaces 42 of the end walls the spring arms 32 are forced to converge thus locking the ends of circuit device 1 securely between the spring fingers 38. Adjustable positioning screws 44 are mounted on the support piston 28. The faces of these screws 44 rest against the back face 6 of the rigid backing 5 of the circuit device 1, best shown in FIGS. 8, 9, and 10.

Insertion of the circuit device 1 into the multi-connector head 8 is demonstrated by the steps represented by FIG. 8, FIG. 9 and then FIG. 10. A reversal of these steps would then permit removal of the circuit device 1.

Figure 11:
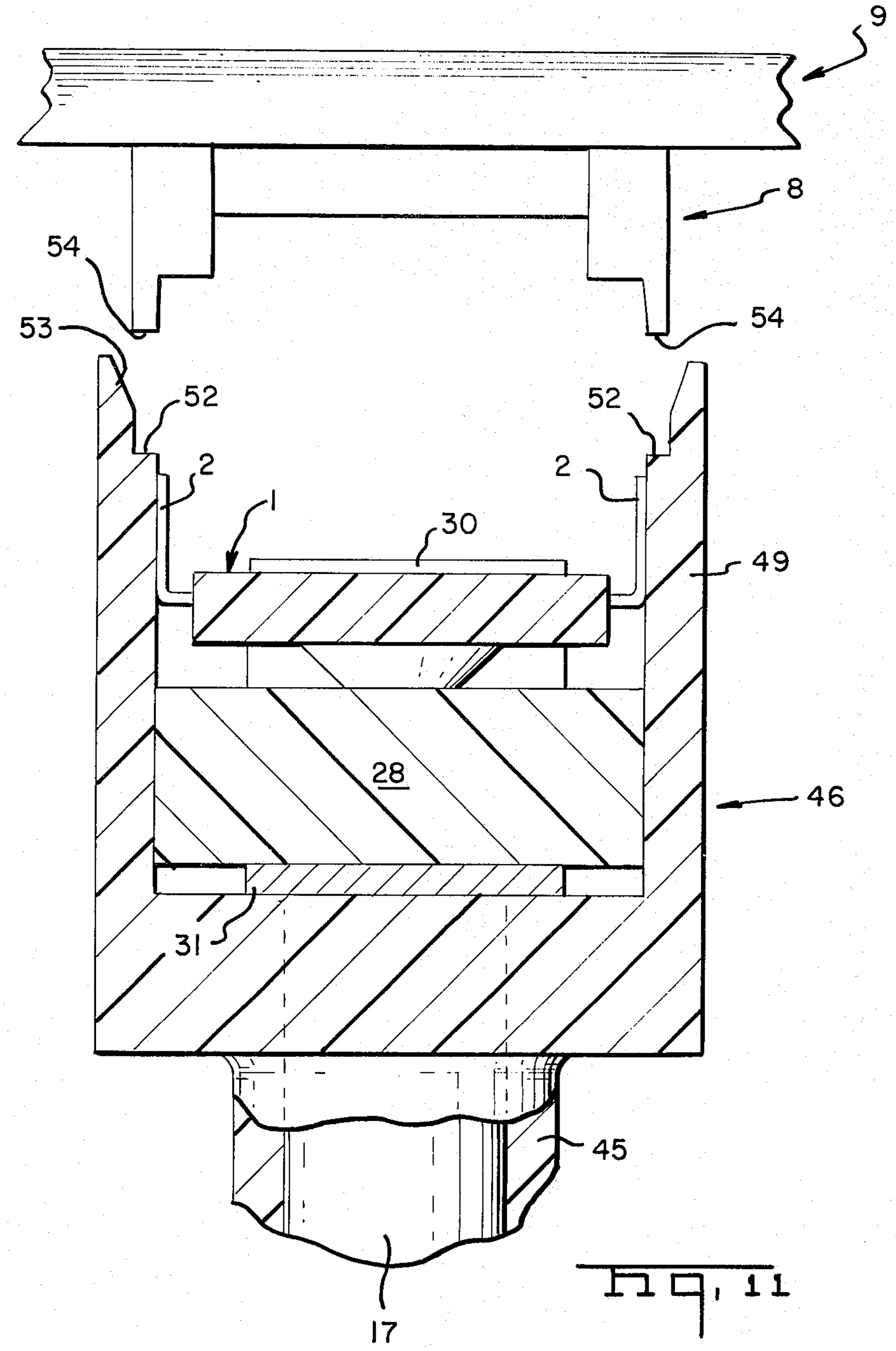
FIG. 11 is a sectional view of the tool head showing the positioning of the tool head with respect to the multi-contact connector.

To prevent damage to the electrical leads 2, the circuit device must be precisely positioned with respect to the multi-connector head 8. FIGS. 1, 4, 8 and 11 show the portions of the tool head 46 which accomplish this alignment. It can be seen from FIGS. 4 and 11 that there is a shoulder 54 on the multi-contact connector header 8 which extends beyond the rigid backing 5 and electrical leads 2 of the circuit device 1. The inner edge of the tool head and sidewalls 49 are indented to form a ledge or shoulder 52, best seen in FIG. 1 and FIG. 11. The multi-contact connector header shoulders 54 and the sidewall ledge 52 then fit together so that the multi-contact connector header 8 and the circuit device 1 are in the proper left-to-right relationship as shown in FIG. 11. The sidewall end stops 53 best shown in FIGS. 1 and 8, provide vertical alignment of the multi-contact head 8 in FIG. 8. The sidewall stops 53 are located adjacent to only one endwall 47 of the toolhead 46. The sidewall stop inner surface 55 abuts the top surface of the multi-contact connector head 8 as shown in FIG. 8. In this manner the precise insertion of the electrical leads 2 is possible.

What is claimed is:

1. An inserting and removing tool for circuit devices of the type comprising a body having leads extending from a first pair of parallel sides, said leads extending in one direction substantially normally of the plane of said body and being arranged in two rows, said body having a second pair of sides which extend between said first pair of sides, said leads being insertible into aligned receptacles in a printed circuit board or the like, said tool comprising:

a tool head having an open side and having too opposed sidewalls which are spaced apart by a distance which is substantially equal to the spacing between said rows, said side-walls having free ends which define said open side of said head, a pair of opposed gripping arms between said sidewalls, said arms having free ends, said free ends being spaced apart by a distance which is always equal to at least the distance between said second pair of sides of said circuit device, actuator means for moving said arms between an extended position through an intermediate position to a retracted position in said head, said free ends of said arms being proximate to said free ends of said sidewalls when said arms are in said extended position, said free ends of said arms being remote from said free ends of said sidewalls when said arms are in said retracted position, arm closing means, said closing means being effective to move said free ends of said arms relatively towards each other during movement of said arms from said extended position to said intermediate position, spaced apart end walls extending transversely to and between said sidewalls, said arm closing means comprising opposed surface portions of said end walls, said opposed surface portions being cooperable with said arms to move said free ends of said arms towards each other upon movement of said arms from said extended position to said intermediate position whereby, a circuit device can be gripped between said arms for the purpose of removing said leads from said aligned receptacles by moving said arms to extended position and locating said device with said second pair of sides between said arms, subsequently moving said arms to said intermediate position so that device is gripped between said arms, and upon subsequent movement of said arms to said retracted position, said device is moved into said tool head.

2. A tool as set forth in claim 1, said arms being the opposed portions of a U-shaped spring member, said U-shaped spring member being attached to a movable piston, said piston moving only within the cavity formed by the opposed sidewalls and opposed end walls and moving in a direction parallel to the planes of said sidewalls and said endwalls, said opposed surface portions of said endwalls being effective to flex said opposed portions of said U-shaped spring member towards each other during movement of said arms from said extended position to said intermediate position.

3. A tool as set forth in claim 1, at least one of said sidewalls having locating means at its free end, said locating means being cooperable with a complementary locating means on a printed circuit board or the like for locating said tool with respect to receptacles in said printed circuit board so that a circuit device held in the tool between the arms will have said leads in alignment with said receptacles.

4. A tool as set forth in claim 3, said locating means comprising shoulder means on at least one of said sidewalls adjacent to said free end thereof, said shoulder means being engageable with said complementary locating means.

5. A tool as set forth in claim 4, said tool being intended to insert said circuit device into receptacles contained in a multi-contact connector mounted on said printed circuit board, said shoulder being engageable with portions of said connector to locate a circuit device held in said tool with said receptacles in said multi-contact connector.

* * * * *